United States Patent [19]

Nozuyama

[11] Patent Number: 5,504,755
[45] Date of Patent: Apr. 2, 1996

[54] TESTABLE PROGRAMMABLE LOGIC ARRAY

[75] Inventor: Yasuyuki Nozuyama, Tokyo, Japan

[73] Assignee: Kabushiki Kaisha Toshiba, Kawasaki, Japan

[21] Appl. No.: 877,215

[22] Filed: May 1, 1992

[30] Foreign Application Priority Data

May 2, 1991 [JP] Japan .................................. 3-101021

[51] Int. Cl.⁶ .................................................. H04B 17/00
[52] U.S. Cl. .................... 371/22.2; 364/489; 364/490
[58] Field of Search .................... 371/22.2, 66, 22.7, 371/22.1, 16.1; 364/489, 490

[56] References Cited

U.S. PATENT DOCUMENTS

| | | | |
|---|---|---|---|
| 3,958,110 | 5/1976 | Houg et al. ................................ | 371/22.2 |
| 4,768,196 | 8/1988 | Jou et al. .................................. | 371/22.2 |
| 4,780,627 | 10/1988 | Illman ....................................... | 371/22.2 |
| 4,857,773 | 8/1989 | Takata et al. ............................. | 371/22.2 |
| 4,959,774 | 9/1990 | Davis ....................................... | 371/66 |
| 5,121,394 | 6/1992 | Russell ..................................... | 371/22.2 |

FOREIGN PATENT DOCUMENTS

| | | |
|---|---|---|
| 59-131182 | 7/1984 | Japan . |
| 60-22678 | 2/1985 | Japan . |
| 62-278818 | 12/1987 | Japan . |

OTHER PUBLICATIONS

Hideo Fujiwara et al., "Enhancing Random-Pattern Coverage of Programmable Logic Arrays via Masking Technique", Proceedings of the IEEE International Test Conference, 1988, pp. 642–648.

Primary Examiner—Emanuel T. Voeltz
Assistant Examiner—Thomas Peeso
Attorney, Agent, or Firm—Foley & Lardner

[57] ABSTRACT

A testable PLA includes a PLA comprising an AND plane and an OR plane comprising input lines, output lines, and product term lines which are grouped into at least two groups; a selector circuit for selecting one of the groups; an activation circuit for activating the selected group; a data generator for providing test data to execute a test for the PLA for the AND plane during a test operation mode, and for providing normal input data for the AND plane during a normal operation mode. The test data consisting of fixed data and variable data provided from the data generator corresponds to the distribution of devices formed at crosspoints between the product term lines of each of the selected groups and input lines.

8 Claims, 12 Drawing Sheets

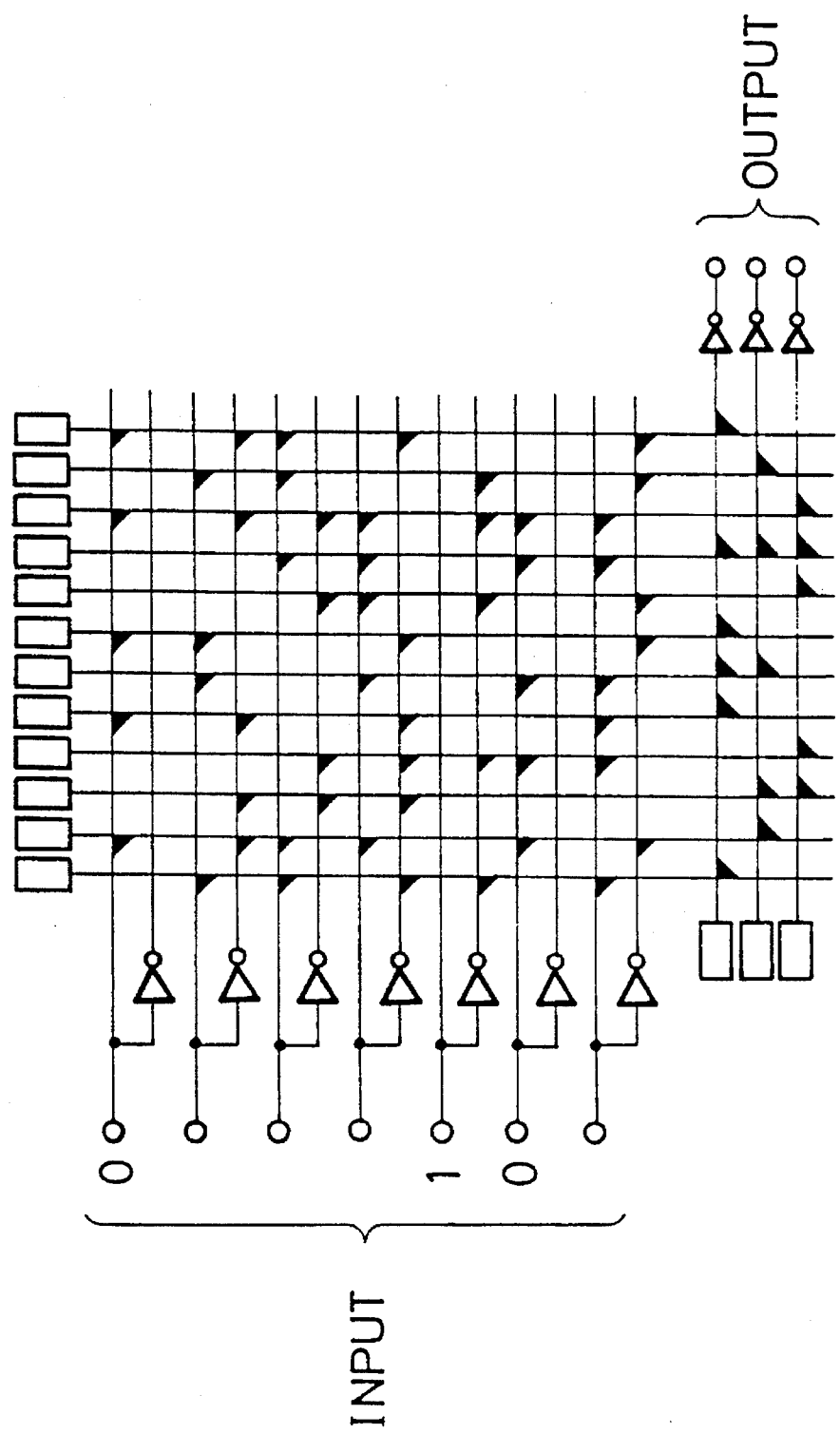

FIG.8

(a) BEFORE GROUPING PRODUCT TERM LINES

```
LITERAL
INPUT LINE      OUTPUT LINE
   ⇓               ⇑
000---00101-0-1111-11-   001
000---0010-00-1111-11-   011
000---000-111-1101-11-   011
-0-----010-01-1111-11-   010
-0----00101---1111-11-   010
000---00----0-1111-110   001
-0----00------1111-110   010
0000--010-----110-0---   001
0000--100-1-1---0-0---   001
0000--100-1-1---0----0  001
0000--100-1-1---1-----  001
0000--010-----110----0  101
0000--1-1-101--0-0--0-  011
0000--00----111100----  011
0000--010-----111-----  100
0000--010-----11----0-  100
00-0--10----01---01--0  010
0000--100-111---------  001
0000--10---01---0--01   011
0000--100-1-1----1----  001
0000--0------0-0--01-0- 001
-01111-----11---------  001
0000--100-1-1---------  100
00-0--10--011---0-----  010
00----1----01---001--0  010
000-------0-1--0-01-01  011
0000--0-------0--01-01  011
-01111-----1-----1----  001
000----1----0--0-01-0-  001
0000--10---01--10----   011
-01111-----1----------  100
00-10-------0--0-01-0-  011
00-0--0-------0--01--0  010
000----1--01--010----   011
000----1--------0-01-01 011
000----10-----11-1----  101
00-1--------1--0-01-0-  010
1-10--1-------------1-  001
000----1---------001--0 010
0001---------0--0-01-0- 011
0000--0-------0--01-01  011
0000---11--------01-0-  011
00----1----01--10-----  010
00-1----------0-01-01   011
00-1----------0-0--10   010
00----0-------0-01--0   010
000-------0-1--010----  011
0000---11--------10----  011
0000--0-------0-10----  011
1-10--1---------------  100
1-10--1----------0----  001
00----11-------10-----  010
01--1------01---------  011
000----1---------010---  011
011--------01---------  011
000----0-------010----  011
-11110----------------  011
00100-----------------  011
00-1--------10-----    010
01--1--------1--------  010
011--------1----------  010
00-1----------010----   011
1--1-----------1--0-   011
1---------------1--1-  010
1-----0---------1--0-  011
1-0-------------1--0-  011
```

(b) AFTER GROUPING PRODUCT TERM LINES

```
LITERAL
INPUT LINE      OUTPUT LINE
   ⇓               ⇑
000---00101-0-1111-11-   001  ⎫
000---0010-00-1111-11-   011  ⎪
000---000-111-1101-11-   011  ⎪
-0-----010-01-1111-11-   010  ⎪ 22 PRODUCT
-0----00101---1111-11-   010  ⎪   TERMS
000----1----0--0-01-0-   001  ⎪
000---00----0-1111-110   001  ⎪
-0----00------1111-110   010  ⎪
0000--010-----110----0  101  ⎪ 0000AA0TT0ITTITTTTTTT
0000--00----111100----   011  ⎪
0000--010-----111-----   100  ⎪ 11 COMMON
0000--010-----11----0-   100  ⎪    INPUT BITS
0000--010-----110-0---   001  ⎪
0000--0------0-0--01-0- 001  ⎪
0000--0-------0--01-01  011  ⎬ GA
00-0--0-------0--01--0  010  ⎪
0000---11--------10----  011  ⎪
0000--0--------0-10----  011  ⎪
000---0---------010----  011  ⎪
00----0---------0-01--0 010  ⎪
000----1---------010---  011  ⎪
000---0---------0-01-01 011  ⎭
──────────────────────────────
00-0--10----01---01--0  010  ⎫
0000--100-1-1---0-0---   001  ⎪
0000--100-1-1---0----0  001  ⎪
00-10-------0--0-01-0-  011  ⎪ 22 PRODUCT
00-1--------1--0-01-0-  010  ⎪   TERMS
0000--10---01---0--01   011  ⎪
0000--100-1-1----1----  001  ⎪
0000--1-1-101--0-0--0-  011  ⎪
0000--100-1-1---------   100  ⎪ 00000AITTITTTIATTTA0T
00-0--10--011---0-----  010  ⎪
00----1----01---001--0  010  ⎬ GB
0000--10---01--10----   011  ⎪
000----1--01--010----   011  ⎪ 12 COMMON
000----0-1--010----    011  ⎪    INPUT BITS
000----1--------0-01-01 011  ⎪
000-------0-1--0-01-01  011  ⎪
000----10-----11-1----  101  ⎪
000----1---------001--0 010  ⎪
0000---11--------01-0-  011  ⎪
00----1----01--10-----  010  ⎪
00----11-------10-----  010  ⎭
00-1-----------10-----  010
──────────────────────────────
00-1-----------010----   011  ⎫
0000--100-1-1--1------  001  ⎪
0000--100-111---------  001  ⎪
0001---------0--0-01-0- 011  ⎪ 22 PRODUCT
00-1----------0-01-01   011  ⎪   TERMS
00-1----------0-0--10   010  ⎪
1-10--1-------------1-  001  ⎪
1-10--1---------------  100  ⎪ TTTTTITT00AIITIA0ITIATT
1-10--1----------0----  001  ⎪
01--1------01---------  011  ⎬ GC
01---------01---------  011  ⎪ 12 COMMON
-01111-----1----------  100  ⎪    INPUT BITS
-01111-----1-----1----  001  ⎪
-01111-----11---------  001  ⎪
-1110-----------------  011  ⎪
00100-----------------  011  ⎪
01--1--------1--------  010  ⎪
011--------1----------  010  ⎪
1--1-----------1--0-   011  ⎪
1---------------1--1-  010  ⎪
1-----0---------1--0-  011  ⎪
1-0-------------1--0-  011  ⎭
```

T : BIT FOR INDICATING SUPPLY OF VARIABLE DATA

A : BIT FOR INDICATING SUPPLY OF ARBITRARILY FIXED DATA

0 : BIT FOR INDICATING SUPPLY OF "0" AS FIXED DATA

1 : BIT FOR INDICATING SUPPLY OF "1" AS FIXED DATA

TESTABLE PROGRAMMABLE LOGIC ARRAY

BACKGROUND OF THE INVENTION

1. Field of the Invention

This invention relates to a testable programmable logic array (a testable PLA) which is an important component used in semiconductor integrated circuits, including logic VLSIs, and more particularly, to a testable PLA in which a testing circuit is incorporated whereby devices formed at crosspoints of input lines and output lines in an AND plane and an OR plane are tested with a high coverage of crosspoint faults, which are characteristic faults of the PLA, and which is provided within a reasonable excess area increase and a suitable number of test cycles.

2. Description of the Prior Art

Recently, a Programmable Logic Array (hereinafter referred to as PLA) has become recognized as a device which is one of the most important logical blocks applicable to VLSI design, by which the VLSI can be easily implemented so that a required logical function is provided at a high density.

In general, a PLA with n inputs and m outputs, as shown in FIG. 1, comprises an n-bit 1-to-2 decoder 1 for producing a literal (xi and $\overline{xi}$) from input xi (i=1 to n=5 in FIG. 1), an AND plane 2 for implementing product terms as a product part of an arbitrary logical function defined by logical AND (product) operations and logical OR operations, and an OR plane for implementing OR terms as an OR part of the logical function. In the AND plane 2, there are input lines and product term lines yj (j=1, ..., p; p=12 in FIG. 1) which are vertical to the input lines. The output lines of the decoder 1 are connected to the input lines (hereinafter referred to as literal input lines) of the AND plane 2. The product term lines of the AND plane 2 are also used as the output lines of the AND plane 2. The product term lines are connected to the input lines of the OR plane 3. In addition, output lines zk (k=1, ..., m; m is 3 in FIG. 1), are also provided vertical to the input lines yi or the product term lines and the outputs f1 to f3 of the PLA to external devices through inverters 17 or drivers are provided in front of the output lines Zi. In this explanation, the crosspoints in the AND plane 2 and the OR plane 3 are formed from MOS transistors, which are described later in detail in this section. The product terms and OR terms in the logical functions for the PLA are realized according to whether or not a device is formed on each crosspoint.

Hereinafter, throughout this specification, a cross point is referred to as a real crosspoint when a device such as a MOS transistor is formed on the crosspoint. Conversely, a crosspoint is referred to as an empty crosspoint when no device is formed on the crosspoint.

With reference to FIG. 1, we will now explain the basic operation of a most conventional PLA and a test method in which a NMOS is formed as an element of a real crosspoint. In the subsequent embodiment according to the present invention, we will describe a test method for testing a testable PLA with a test circuit according to the present invention.

First, as shown in FIG. 1, each of the actual cross points, which are designated as black triangle marks on the PLA, has a configuration, as shown in FIG. 2. When a high level voltage (hereinafter defined as logical "1", and designated simply as "1") is provided to a real crosspoint, as shown in FIG. 2, a NMOS transistor as the real crosspoint enters the ON state electrically, the output of the NMOS becomes a low level voltage (hereinafter defined as logical "0"). Conversely, when logical 0 is applied to the input "In" of the real crosspoint, the NMOS enters the OFF state.

In this case, the logical value of the output of the real crosspoint cannot be determined by the input "In", and all real crosspoints on an output line, including this real crosspoint, make the output logical 1 when all these real crosspoints enter the OFF state. The product term lines yj (j=1, ..., p) and the output lines zk (k= 1, ..., m) such as the above output line are connected to load circuits 15 and 16, respectively, as shown in FIG. 1, and electrical charge from the load circuits 15 and 16 is stored in these product term lines yi and the output lines zk only when all real cross points on each of these lines yi and zk are on the OFF state. Consequently, the output of each line enters the logical 1 state. For example, the product term line y2 outputs logical 1 when the input data (x1,x2,x3,x4,x5) is (x,0,x,0,0), where x denotes "don't care". As a result, the real crosspoint on the input line y2 in the OR plane 3 enters the ON state, resulting in z2=0. That is, the output f2 of the OR plane 3 becomes logical 1. With input data other than that described above, the product term line y2 is logical 0, so that it cannot determine the value of the final output f2 of the PLA, namely the output f2 of the OR plane 3. There is no real crosspoint between the product term line y2 and the output lines z1 and z3, so that the value of the output lines z1 and z3 cannot be affected by the value of the product term line y2. As a final explanation of the conventional PLA operation, the Boolean expression of the logical function f2 in FIG. 1 is shown in the following:

$$f2 = z2 = \overline{\text{(product term of } y2) + \text{(product term of } y3) + \overline{\text{(product term of } y7) + \text{(product term of } y11) =}}$$

$$\overline{x2}\,\overline{x4}\,\overline{x5} + \overline{x1}\,x2\,\overline{x3} + x2\,x4\,\overline{x5} + \overline{x3}\,\overline{x4}\,x5.$$

The PLA is very suitable for designing a VLSI, as described above, however, it is well known by a person skilled in the art pertaining to the PLA that there are many problems in testing the PLA operation, due to the following reasons:

(1) Both the AND plane and the OR plane of a PLA are Large fan-in logic; and (2) The state of a product term line as an output line of an AND plane cannot be directly tested only by using a given circuitry for normal operation.

In the prior art, various types of PLA test methods have been proposed. These test methods are classified substantially into the following two kinds.

(1) METHOD OF APPLYING ALL INPUT PATTERNS

In this method all possible ($2^n$) input patterns are provided. The simplest way of executing this method is to use the input register of the PLA to be tested as an n-bit LFSR (Linear Feedback Shift Register), specifically as a pseudo-random input data generator for automatically generating pseudo-random input data in a test operation. In this case, the output register (not shown) of the PLA is chanced into the m-bit parallel input LFSR and used as a signature analyzer.

Cumulative resultant data (signature) of output from the PLA according to input from the pseudo-random input data generator is stored in the m-bit parallel input LFSR (referred to as signature compression). A signature has a characteristic value corresponding to an output sequence from the PLA. After $2^n$ test cycles, the resultant data of the test operation stored in the m-bit parallel input LFSR (which in a normal operation mode is used as an output register of the PLA) are read out and then compared with an already prepared expected value. The LFSR cannot generate more than $2^n-1$ test cycles, so that the remaining data must be provided by using another circuitry. A n-bit counter can be also used as an automatic input data generator.

This method requires an additional circuit with a simple configuration. For example in this circuit, input and output registers of the PLA are replaced by the LFSR. The number of required test cycles is $2^n$. Accordingly, this method is readily available so long as the number of inputs for the PLA is small, for example n<20, but such a case is rare in recent VLSI design. In general, when the number of inputs n is greater than 20, namely n>= 20, it is difficult to carry out the test operation for the PLA by this method (1). In other words, it is difficult to obtain an expected value for signature compression by using logical simulation before designing a chip. Moreover, it is also difficult to analyze faults such as stuck-at faults, bridging faults, and crosspoint faults consisting of disappearance of a crosspoint or a crosspoint generation, which are described later in detail referring to FIG. 4. This is an important problem in improving VLSI productivity and development.

To avoid this problem, there is an easy method in which all possible input patterns are not used, and the test operation is stopped after a suitable number of patterns has been applied. But, by this method the cross point faults, which are described later in detail, are only detected accidentally, so that they cannot be perfectly detected. Therefore the reliability of the test operation is low. This is an important problem in reliability of VLSI design and fabrication.

(2) METHOD OF ACTIVATING EACH PRODUCT TERM LINE

As described above, the difficulty of the PLA test operation is caused by large fan-in logic based on many input bits at the AND plane and OR plane and low testability, meaning controllability and observability, of the product term lines, i.e., the output lines of the AND plane. In general, when the input of a logic circuit can be easily controlled and the output of the logic circuit can also be easily observed, the logic circuit can be easily tested.

Considering the input of the AND plane in the PLA are perfectly controlled and the output of the PLA, namely the output of the OR plane, can be completely observed, it is clear to a person skilled in the art that this enhances the testability of the product term lines as the output of the AND plane, which is equal to the input of the OR plane, and increases the testability of the PLA.

In this method, a considerable amount of test circuitry is added to the PLA to increase the degree of testability of the PLA.

We will first discuss the crosspoint faults before describing the configuration of a self-test circuit incorporated in the PLA.

The crosspoint faults are introduced directly from the physical structure of the PLA. These kinds of faults, crosspoint disappearance and crosspoint generation, are defined as follows. In the former a crosspoint disappears where a real crosspoint is required, while in the latter, an unnecessary crosspoint is generated on the PLA, respectively, due to the failure in the fabrication process for the PLA in which logical functions are implemented.

As shown in FIG. 4, when the PLA is formed by using MOS transistors, the crosspoint disappearance results from an open fault around a MOS transistor. On the other hand, the crosspoint generation relates to a MOS transistor generation fault formed at an empty crosspoint. However, in most present PLA fabrication process techniques, a fault of the crosspoint generation is never produced because in the PLA fabrication process technique the presence of a MOS transistor formed on a crosspoint depends on the presence of a channel region of the MOS transistor. In this case, a bridging fault is similar to the crosspoint generation fault, but this bridging fault can be distinguished from the crosspoint generation fault.

There is a somewhat exceptional example of a PLA wherein MOS transistors are formed at all of the crosspoints on the PLA. In that PLA, a real crosspoint is formed by connecting a gate of a MOS transistor to a literal input line in the AND plane, or a product term line in the OR plane.

In this case, a crosspoint generation fault is caused by the fact that a gate of a MOS transistor at an empty crosspoint is accidentally connected to an input line as a result of a fabrication process failure. However, the probability of crosspoint generation fault is lower than that of a crosspoint disappearance fault. As described above, in general, the probability of a crosspoint disappearance fault is higher than that of a crosspoint generation fault.

The detection of the crosspoint faults mentioned above, for the AND plane and the OR plane is carried out in a different manner.

In the OR plane, if each product term line is solely effective for the OR plane (the meaning of "effective" will be described later), the distribution of the crosspoints on the product term line in the OR plane can be observed at the output of the PLA. Therefore, under the above condition, the crosspoint faults, that is, the crosspoint generation faults and the cross point disappearance faults, in the OR plane can be detected.

A crosspoint fault in the AND plane can be detected only when (i) all product term lines except a product term line including the tested crosspoint are ineffective, and (ii) the product term line becomes effective or ineffective for the OR plane depending on whether the crosspoint is real or empty. Accordingly, the crosspoint faults in the AND plane are detected indirectly.

In the below, from a standpoint to realize the individual activation of each product term line for the OR plane, the test operation for a PLA will be explained in the following steps:

(1) First, crosspoint generation faults in the AND plane neglected. Specifically, the empty crosspoint is disregarded as "don't care"; and (2) Then the crosspoint generation faults in the AND plane are treated.

Through the steps (1) to (2), it will be shown that all of the crosspoint faults can be detected.

As can be clearly understood by replacing, the distribution of crosspoints in the PLA with logic gates, it is difficult to express the crosspoint faults by using a single stuck-at fault model obtained by using a circuit expressed by the combination of logic gates. Accordingly, a sufficiently high coverage of crosspoint faults cannot be obtained by using test patterns generated by a usual ATPG (Automatic Test Pattern Generation) tool in which fault is assumed for logic functions implemented in the PLA by product terms and OR terms.

Accordingly, to obtain the test for a PLA with very high reliability, crosspoint faults must be assumed as faults to be detected.

The following example follows this methodology.

FIG. 5 shows an example of a circuit block of a PLA. The prescribed method is applied to the PLA shown in FIG. 5 based on the PLA shown in FIG. 1. Accordingly, the same reference numbers through FIG. 1 and FIG. 5 are used for the same components and same functions. In FIG. 5, a load circuit 22 is separated from the AND plane 2. However, the load circuit 22 can be, in general, included in the AND plane 2. Therefore, in the following, sometimes the load circuit 22 is not explicitly depicted.

In FIG. 5, circuits surrounded by closed broken lines designate additional circuits for testing the PLA. These circuits comprise a 1-to-2 bit decoder 7 with an output disabling circuit, a literal input line disabling circuit 21 for setting one of each literal lines xi and $\overline{xi}$ in the ineffective state, and an additional AND plane 23 for activating one of the product term lines. The 1-to-2 bit decoder 7 with the output disabling circuit controls the state of the inputs t1 to t4. The state of the inputs t1 to t4 select one of the product term lines in the additional AND plane 23 during the test operation for the PLA 2 carried out when a test mode input T=1.

When T=0, which is called the normal operation mode, all of the t1 to t4 become logical 0, so that the output of the product term lines does not depend on the inputs t1 to t4 and depends only on the inputs X1 to X5.

The literal input line disabling circuit 21 is used for testing the AND plane 2 (during at T=1; the content is described later), by which one of the literal inputs xi and $\overline{xi}$ (i=1 to n) is set into the ineffective state, namely 0.

The literal input Xi (i= 1, . . . , n) becomes 0 when c1 is 1. The literal input $\overline{Xi}$ (i=1, . . . , n) becomes 0 when C2 is 1. An input register and an output register are neglected in FIG. 5 for simplicity. In this example, a predetermined input pattern must be used. It is desirable that the input register functions as a shift register during the test operation mode.

When the self-test method or the BIST (Built-In Self Test) is used for the PLA test, it is required that the output register be replaced with a parallel input LFSR as a signature analyzer.

When the number of bits of output lines of the PLA is relatively small, for example m<20, it is required that the output register of the PLA be combined with another register to form a signature analyzer with a rather long bit length to avoid an aliasing problem. The signature compression is defined as a cumulative data or a signature indicating the sequence of the output from the PLA being stored in the signature analyzer during the self-test operation. An aliasing problem is defined as obtaining a signature after the completion of the self-test operation which is the same as the signature obtained from the correct circuit in spite of the output sequence from the PLA including erroneous outputs.

In addition, it is necessary to execute the test operation efficiently so that signals C1,C2,t1,t2,t3, and t4 are provided by a test-purpose counter or a LFSR. These additional circuits described above depend on the kinds of test operation and test object, but are easily implemented. The addition of the test circuits does not substantially affect the test operation of the PLA.

As can be clearly understood from the above explanation, in this example the crosspoint faults are detected basically by activating each of the product term lines.

The activation of a product term line is defined as the logical value of the product term line being determined by a literal input to the AND plane 2.

The inactivation of the product term line is defined as the output of the product term line which makes crosspoints formed on this product term line in the OR plane be inactive, namely it becomes zero, regardless of a literal input value.

As for the meaning of "enable" and "disable", an input line to an AND plane or an OR plane is enabled when it has a logical value that transistors at real crosspoints on the input line in the plane are in the On state, and is disabled when it has a logical value that these transistors are in the OFF state.

In this situation, by utilizing the above described circuits which activate each of the product term lines, the following test operations are carried out under the condition of T=1.

(A) TEST OPERATION FOR OR PLANE

In this test operation, each of the product term lines isactivated under the condition that an input pattern (t1,t2, t3,t4) provided to the additional AND plane 23 is changed under C1=C2=1, and all of the literal input lines become inactive or disabled. As shown in FIG. 5, the product term lines are activated only one by one from the left to the right in accordance with the change, the increase by 1 of the value of the input pattern (t1,t2,t3,t4) for example (0,0,0,0), (0,0, 0,1), (0,0,1,0), . . . .

Thereby, the distribution of the crosspoints on each product term line in the OR plane can be observed directly at the output of the PLA. The number of test cycles in the test operation for the OR plane is p, which equals the number of product term lines.

(B) TEST OPERATION FOR AND PLANE

This test operation comprises two kinds of tests (a) and (b). The total number of test cycles is 2np.

(a) Each product term line is activated in sequence in the same manner as the test operation for the OR plane under the condition that the literal input lines xi (i=1, . . . , n) are disabled when C1 is 1 and C2 is 0, in addition the input (x1,x2,x3,x4,x5) is (1,1,1,1,0). Specifically, one of the literal input lines $\overline{x5}$ is enabled. Thereby, the state of the crosspoint at $\overline{x5}$ in the AND plane 2 and each product term line can be detected. If a real crosspoint is formed, the value of the product term line is zero, and all bits of the PLA output are zero. Conversely, if there is no real crosspoint, the value of the product term line is 1, and the distribution of the crosspoints on the product term line in the OR plane 3 can be detected on the output of the PLA. Therefore, the crosspoint fault in the PLA can be easily detected. In the next operation, the input is shifted by 1 bit, namely (x1,x2,x3, x4,x5) is (1,1,1,0,1), each product term line is activated in the same manner as for the OR plane, and the state of crosspoints between the literal input line $\overline{x4}$ and the product term lines are checked. Similarly, crosspoint faults between the product term lines and each of the literal input lines $\overline{x3}$, $\overline{x2}$, $\overline{x1}$ are detected.

(b) Each product term line is activated in sequence in the same manner as the test operation for the OR plane under the condition that the literal input lines $\overline{xi}$ (i=1, . . . ,n) enter the inactive state when C1 is 0 and C2 is 1, in addition, the input (x1,x2,x3,x4,x5) is set to (0,0,0,0,1). Specifically, one of the literal input lines x5 is effective. Thereby, the state of the crosspoint at x5 in the AND plane 2 and each product term line can be detected.

Similarly, crosspoints between the product term lines and each of the literal input lines x4, x3, x2, x1 are detected.

As can be understood by the above description during the test, applying two sets of data ($\overline{c1}$, $\overline{c2}$) and (t1,t2,t3,t4) through two kinds of counters CNT1 and CNT2, respectively, and making the counter CNT1 count up by the output of a sequencer with a simple configuration having an overflow signal from the counter CNT and the input x1 as two inputs, result in the test for the OR plane, the test (a) for the AND plane, and the test (b) for AND plane being automatically executed. These test operations are very simple and suitable for a self-test of a PLA.

As described above, in the example, each crosspoint fault can be surely detected, so that a test with very high quality is provided. Moreover, the number of test cycles required for the test operation is 2np+p, which is much smaller than that required for the first conventional example. However, the area of the additional circuit to be incorporated into the PLA for activating each product term line becomes excessive for the PLA. This is a serious problem. There are the following methods for activating each product term line, for example.

(1) Method of adding additional literal input lines into the AND plane; and (2) Method of adding a flip flop capable of transferring data serially into each product term line.

In the method (2), however, the area of the flip flop is considerably large among various circuit elements. In addition, the area increase of the required flip flops is proportional to the increase in the number of the product term lines. Accordingly, from the view point of area increase it is not practical to adopt the method (2) for VLSI design. Therefore the method (1) is commonly used. However, it also has a problem that the input to the additional AND plane becomes ([$Log_2$ P]+1) bits for the number P of product term lines, where, the symbol [x] is the maximum integer less than the real number x.

In general, when the [$Log_2$ P] of the PLA is near to the input number n, which is often seen in an ordinary VLSI, for example, when N=20 and P=200 to 300 [$Log_2$ P] becomes 7 or 8 so that the additional circuit for activating each product term line occupies ⅓ of the AND plane area. Therefore the extra area for the PLA is much increased and its operational performance is badly degraded.

SUMMARY OF THE INVENTION

Accordingly, it is an object of the present invention to provide a PLA with a self-test circuit which can detect crosspoint faults at a very high order rate.

A testable Programmable Logic Array (PLA), as a preferred embodiment according to the present invention, comprises:

a PLA comprising an AND plane and OR plane comprising a plurality of input lines, a plurality of output lines, and a plurality of product term lines which are perpendicular to the input lines and the output lines;

data providing means for providing test data to execute a test for the PLA for the AND plane during a test operation mode, and for providing normal input data for the AND plane during a normal operation mode, wherein the test data consisting of fixed data and variable data provided from the data providing means corresponds to the distribution of devices formed at crosspoints between the product term lines and the input lines.

A testable Programmable Logic Array (PLA) as another preferred embodiment according to the present invention comprises:

a PLA comprising an AND plane and an OR plane comprising a plurality of input lines, a plurality of output lines, and a plurality of product term lines which are grouped into at least two groups and which are perpendicular to the input lines and the output lines;

selection means for selecting one of the groups;

activation means for activating the selected group;

data providing means for providing test data for implementing a test for each part of the PLA covered by the product term lines of each said selected group for the AND plane during a test operation mode, and for providing normal input data for the AND plane during a normal operation mode, wherein the test data consisting of fixed data and variable data provided from the data providing means corresponds to the distribution of devices formed at crosspoints between the product term lines of each said selected group and the input lines.

The above and other objects, features and advantages of the present invention will be apparent from the following description of preferred embodiments of the present invention with reference to the accompanying drawings.

BRIEF DESCRIPTION OF THE DRAWINGS

FIG. 7 is a diagram showing a method for selecting fixed data in the PLA shown in FIG. 6;

FIG. 8 shows an example of a method for grouping product term lines into groups;

DETAILED DESCRIPTION OF THE EMBODIMENTS

The basic concept of the present invention will first be described.

Figure 1:
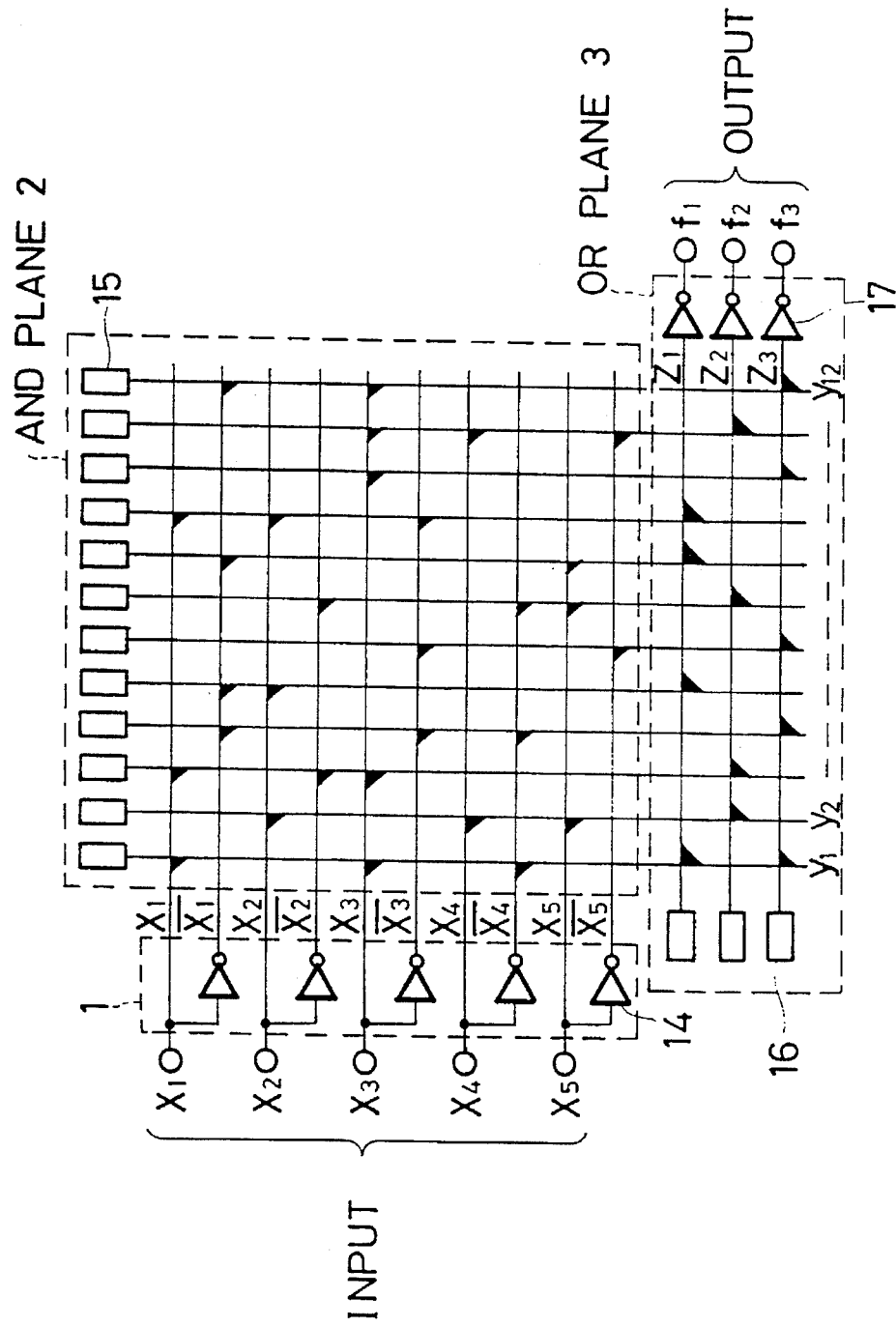
FIG. 1 is a configuration diagram of a conventional PLA.
Figure 2:
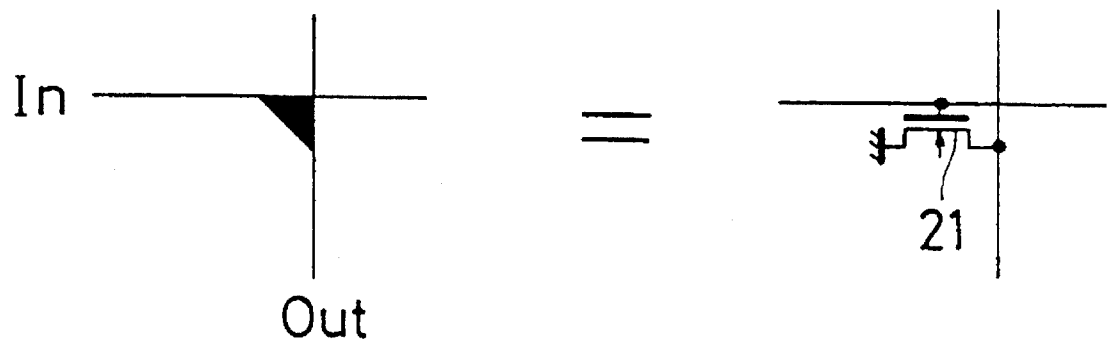
FIG. 2 is a symbolic diagram and a circuit diagram of a real crosspoint formed in a conventional PLA.
Figure 3:
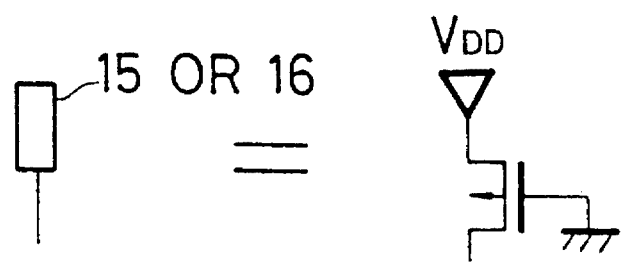
FIG. 3 is a drawing of a load circuit for precharging a product term line in a conventional PLA.
Figure 4:
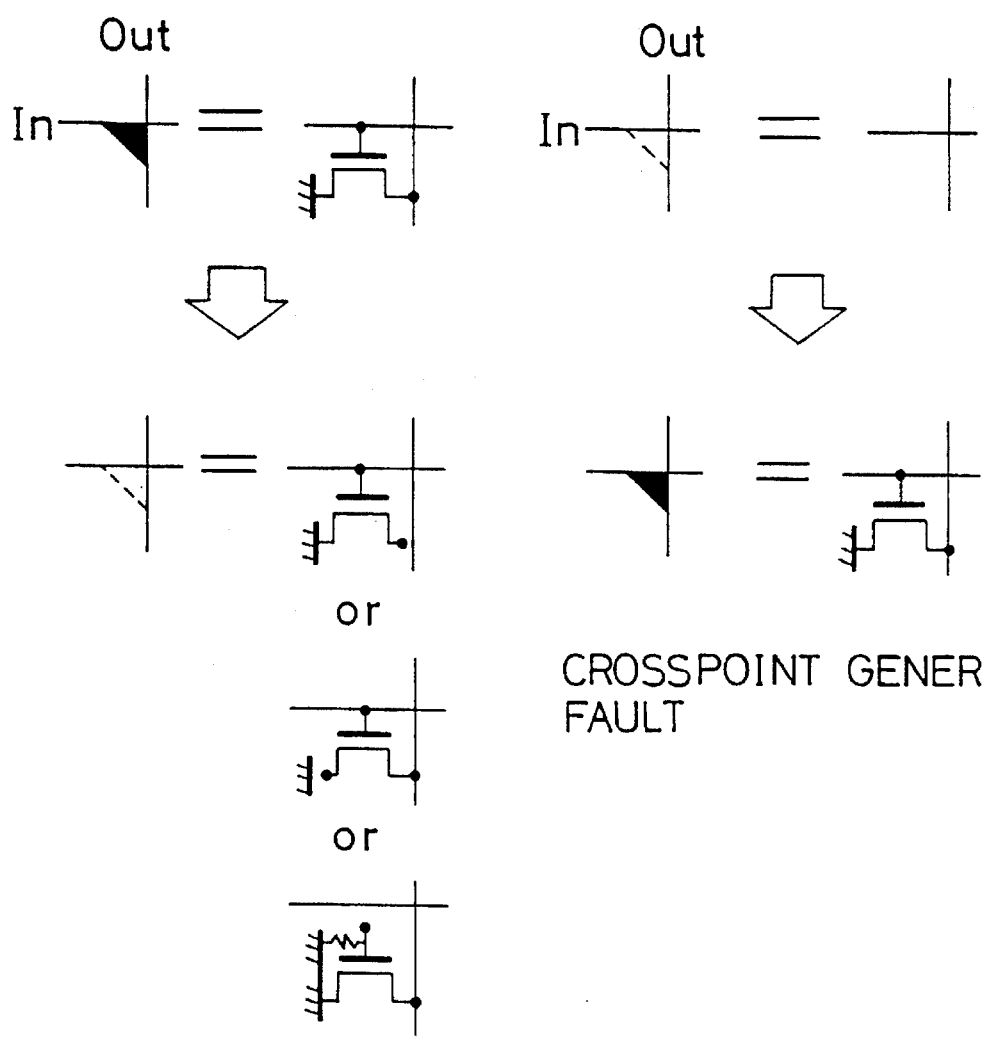
FIG. 4 shows two kinds of crosspoint faults and a diagram of a MOS element including the crosspoint faults.
Figure 5:
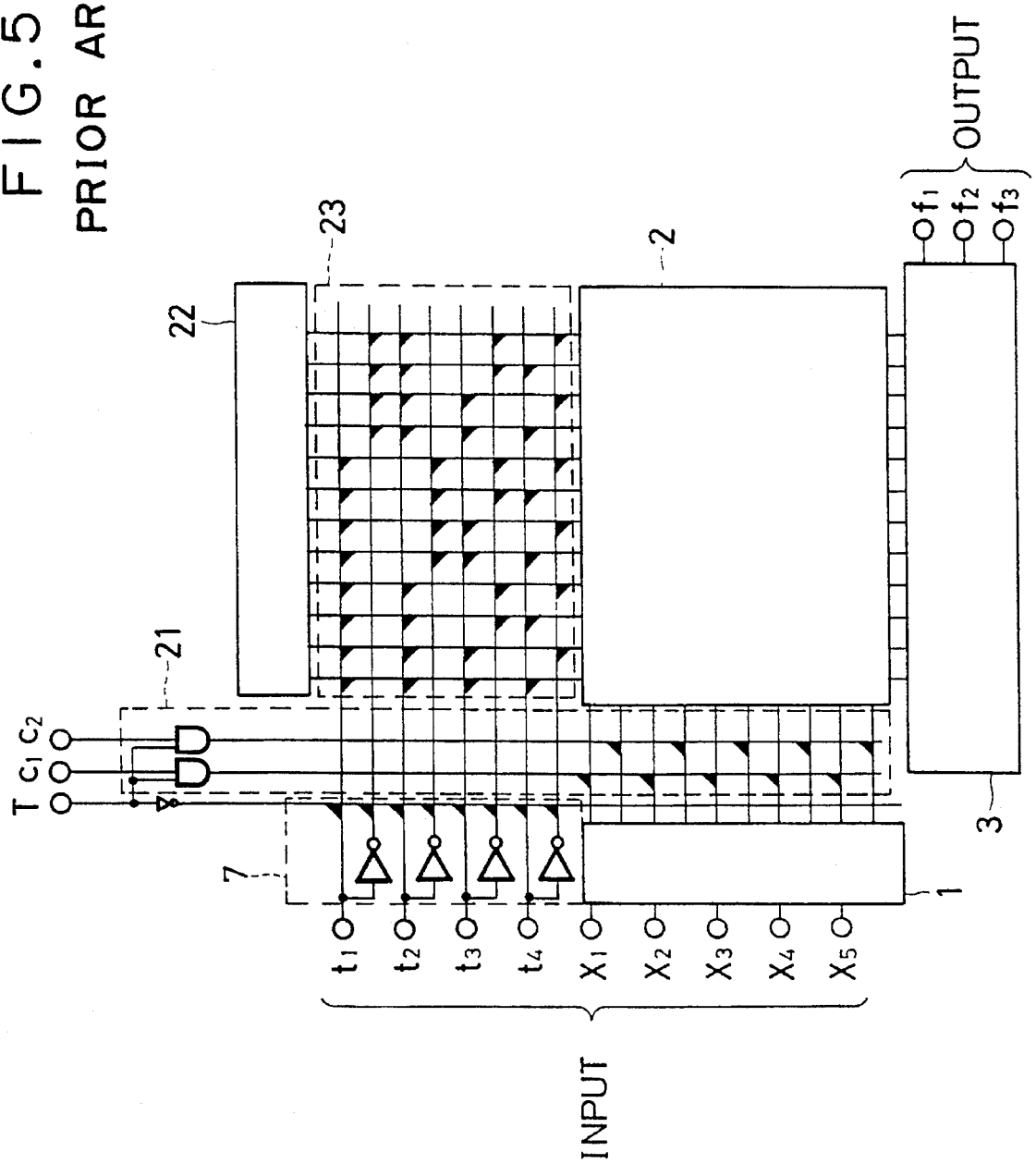
FIG. 5 is a circuit diagram of a testable PLA using a conventional technique for activating each product term line.
Figure 6:
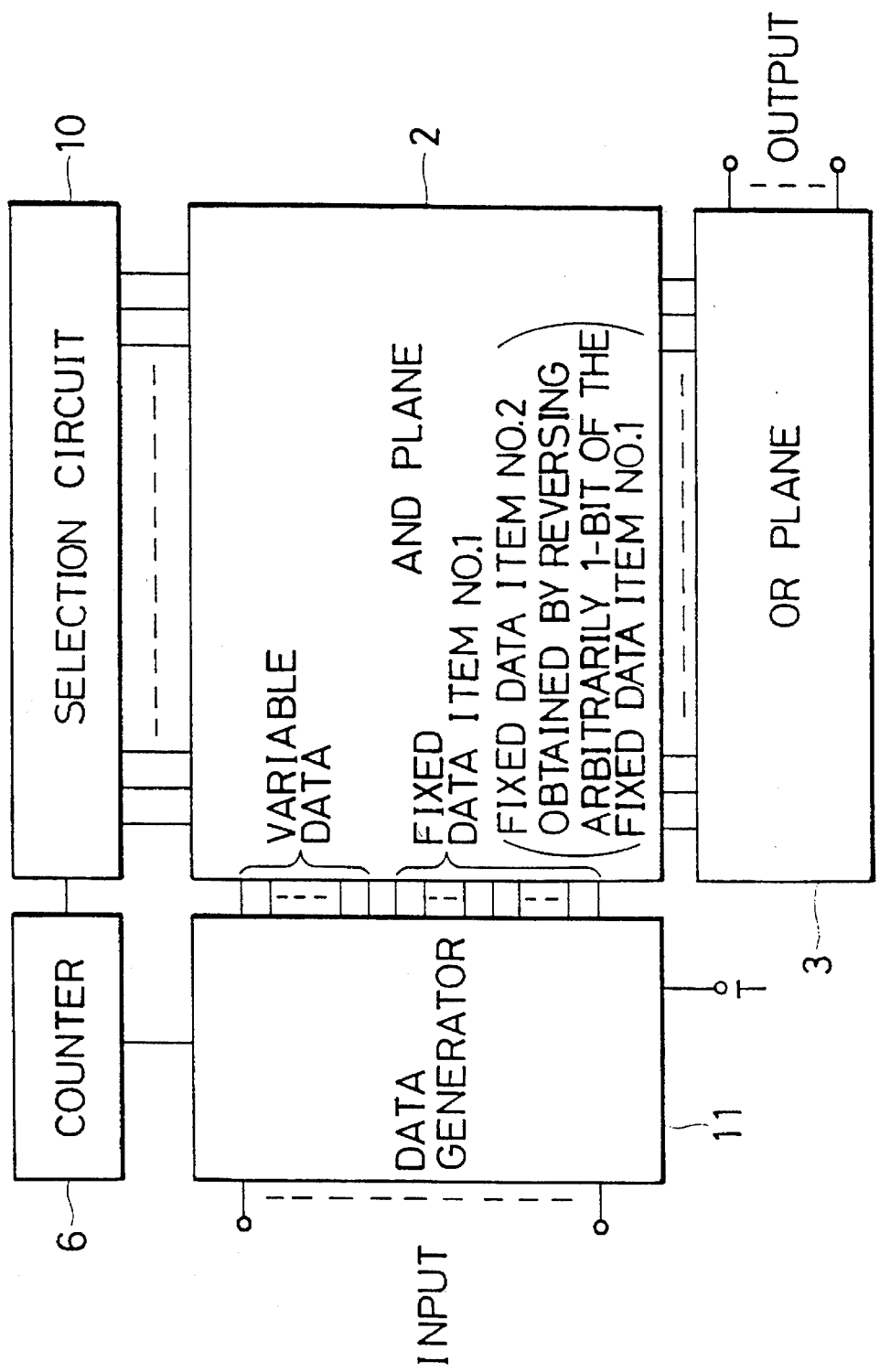
FIG. 6 is a schematic configuration diagram of a testable PLA with a test circuit according to the present invention.

As can be clearly understood by the example of the conventional testable PLA shown in FIG. 5, to detect all possible crosspoint faults, it is important to activate each of the product term lines. However, the effect of this activation is not necessarily obtained only by activating each of the product term lines with a large extra area, as shown in the example in FIG. 5. Nearly the same effect can be achieved by a method for using suitable input in accordance with a crosspoint distribution of a group consisting of a plurality of product term lines.

A product term line can be solely enabled for the OR plane so long as at least one transistor at a real crosspoint on each of the other product term lines enters the "On" state and all real crosspoints on the product term line enter the "OFF" state.

The present invention tries to take full advantage of this point to implement the high quality testing method for the PLA. It will be easily understood that, by observation of the output of the PLA according to the input described above, the crosspoint faults on the product term lines can be surely detected.

There is another aspect related to the present invention.

In general, looked into in detail, there are many empty crosspoints in a PLA used for a usual VLSI. In addition, there are many product term lines with a similar distribution of crosspoints. That is, in a PLA used in a usual VLSI, input is divided into several fields which are grouped highly independently to achieve high performance in operation and to provide simple control structure.

One of the features of the present invention is to group product term lines into several groups, each of which has a similar distribution of crosspoints observed from the input of the PLA. In each group, crosspoints having a common distribution are provided with fixed data, and other crosspoints with a different distribution are provided with variable data for activating each crosspoint. By using this method, the amount of test data and the number of test cycles can be practical and a very high coverage of crosspoint faults and other types of faults can be achieved, with a small increase of area.

We will describe an example of grouping the product term lines and explain several configurations for test data generation circuits.

In the grouping method according to the present invention, product term lines are divided into several groups, and in each group, each product term line has a similar distribution for the real crosspoints. In a test operation for a PLA, an additional AND plane is constructed to activate each group. A specific example of this grouping method is described in detail below, referring to FIG. 8.

Although in certain PLAs the grouping of product term lines is not required, as regards the basis for whether or not the product term lines are grouped, the following product term line grouping method can also be applied to such PLAs. Accordingly, the explanation of such PLAs is omitted.

This grouping method can be implemented by a designer by using a work station while a distribution of crosspoints on a PLA is displayed, provided there are 200 or 300 product term lines, as in many usual VLSIs. However, when there are more than 300 product term lines, a special CAD tool for implementing the grouping method will be required. It should be noted that this grouping is done at the logic description level, so that it is not necessary to layout the product term lines of each group together in one region of a PLA.

In the following explanation, covering several embodiments, the product term lines of each group are located at one region for ease of understanding.

Another object of the present invention is to substantially reduce the number of test cycles compared with the first conventional method and to surely detect the crosspoint faults by first activating each group of product term lines for the OR plane and enabling each product term line.

These objects are achieved by the method according to the present invention, in which fixed data for the product term lines in each group is provided from input bit lines with a similar distribution of crosspoints observed from the input of the PLA to become inactive for output of the product term lines during a test operation mode (or the output of the product term lines is not affected fixed data). Variable data is provided through a counter for other input bit lines from which a different distribution of crosspoints of the product term lines is observed. In this case, the variable data is treated with a conventional method.

Further, to perfectly implement this method, in addition to the fixed data described above, sometimes another type of fixed data (fixed data with one bit inverted) is also required.

Dependent on real crosspoint distribution, a plurality of the product term lines is activated at the same time. In this case, it can be shown that the same result can be obtained as if each product term line were enabled, so long as there is no redundant crosspoint distribution. This will be explained later in detail.

Thus, in the test method of the present invention, a fixed data is provided to a common distribution in a group consisting of the product term lines which are activated at the same time, and a variable data is provided to the other input lines to enable each product term line for the OR plane in the test operation. In the method for providing fixed data to the common distribution, firstly from the view point that there are no crosspoint generation faults as have already been described in the prior art, the fixed data is provided to the common distribution and the variable data is provided to the different distribution according to the real crosspoint distribution in which empty crosspoints are neglected.

That is, specifically, as shown in FIG. 7, for an input bit $Xi$ ($i=1,\ldots,n$) whose literal input lines are $Xi$ and $\overline{Xi}$ only on either one of which real crosspoints are distributed, a fixed data is provided so as to disable the literal input line with the real crosspoints for the OR plane. In addition, when there is no real crosspoint, arbitrary fixed data can be provided. Thereby, the number of the bit lines to which fixed data is provided is increased, namely the number of test cycles is decreased. On the other hand, all possible variable data is provided to input bit lines in which there are real crosspoints for both the literal input lines $Xi$ and $\overline{Xi}$.

In the estimation of the upper limit of the number of test cycles of the method according to the present invention, when the number of the groups of the product term lines is $2^g$, and the minimum number of input bits provided with fixed data for each group of product term lines is f, the upper limit becomes $2^{n+g-f}$. Accordingly, when g is smaller than f, namely g<f, the total number of test cycles is smaller than $2^n$. In most actual VLSI design, the relationship, namely g<<f is satisfied. By using this method of the present invention, the number of test cycles for the PLA can be much decreased compared with the first conventional method described above.

FIG. 8 shows an example of grouping the product term lines according to the distribution of the crosspoints. The configuration of the product term lines before and after grouping are shown.

In this example, the PLA is used in a 32 bit microprocessor, with 22-bit input, 66 product term lines, and 3-bit output.

FIG. 8(a) shows the configuration before grouping and FIG. 8(b) shows the distribution after grouping. In this embodiment, all of the product term lines of the PLA are grouped as shown into GA, including the 22 product term lines each having 11 common bits, GB, consisting of 22 product term lines each having 12 common bits, and GC, with 22 product term lines each having 12 common bits.

The fact that the number of product term lines in each group is 22, has no special meaning.

As can be easily understood by executing a simulation, almost all product term lines are enabled for the OR plane in this embodiment by using the method according to the present invention.

It is easily estimated from the embodiment that 2, 3, or 4 groups are sufficient for most PLAs in recent VLSIs. In this case, the number of input bits for the additional AND plane is 1 or 2 bits. Accordingly, compared with the conventional test method shown in FIG. 5, where each product term line is activated by using an excessive additional AND plane with $[\log_2 P]$ bit input, the method of the present invention requires much smaller extra area.

Further, the number of test cycles becomes $2^{22-11}+2\times2^{22-12}$=4000, which is easily executed. On the other hand, the test cycles required for the first conventional method becomes approximately $2^{22}$=40,000,000 cycles, which cannot be executed in actual practice.

In the above embodiment according to the present invention, for the simplicity of the configuration of additional test circuits, fixed data is provided for the common part of the distribution of in crosspoints each group of product term lines in the AND plane. In this case, however, the problem remains that the disappearance of a real crosspoint present in the common part cannot be detected.

To solve the problem, as the second method of the present invention, for example, the test operation described above must be executed repeatedly with the fixed data described above and with another fixed data obtained by inverting any one bit of the fixed data.

Thereby, the product term lines, which has a real crosspoint at a crosspoint between either of a pair of literal lines corresponding to an inverted bit of fixed data, are not enabled for the OR plane during the test operation using the modified fixed data, though they are enabled during the test operation using the original fixed data according to some combination of variable input data.

Therefore crosspoint disappearance faults can be detected. Further, as can be easily understood, crosspoint generation faults on the AND plane can be detected by the method using fixed data and one-bit inverted fixed data. Thus almost all of the crosspoint faults can be detected by this second method. In addition both the crosspoint disappearance faults and the crosspoint generation faults can be detected in the OR plane. This means that by the second method of the present invention crosspoint faults can be almost completely detected. The additional test circuit is slightly more complicated than that in the first embodiment, and the number of test cycles becomes $(1+f)\times 2^{n+g-f}$. Whether the second method should be fully implemented or not depends on the number of real crosspoints between product term lines of a group and a fixed-data input line. Examples of the second method are described later, referring to FIG. 12 and FIG. 13.

Figure 9:
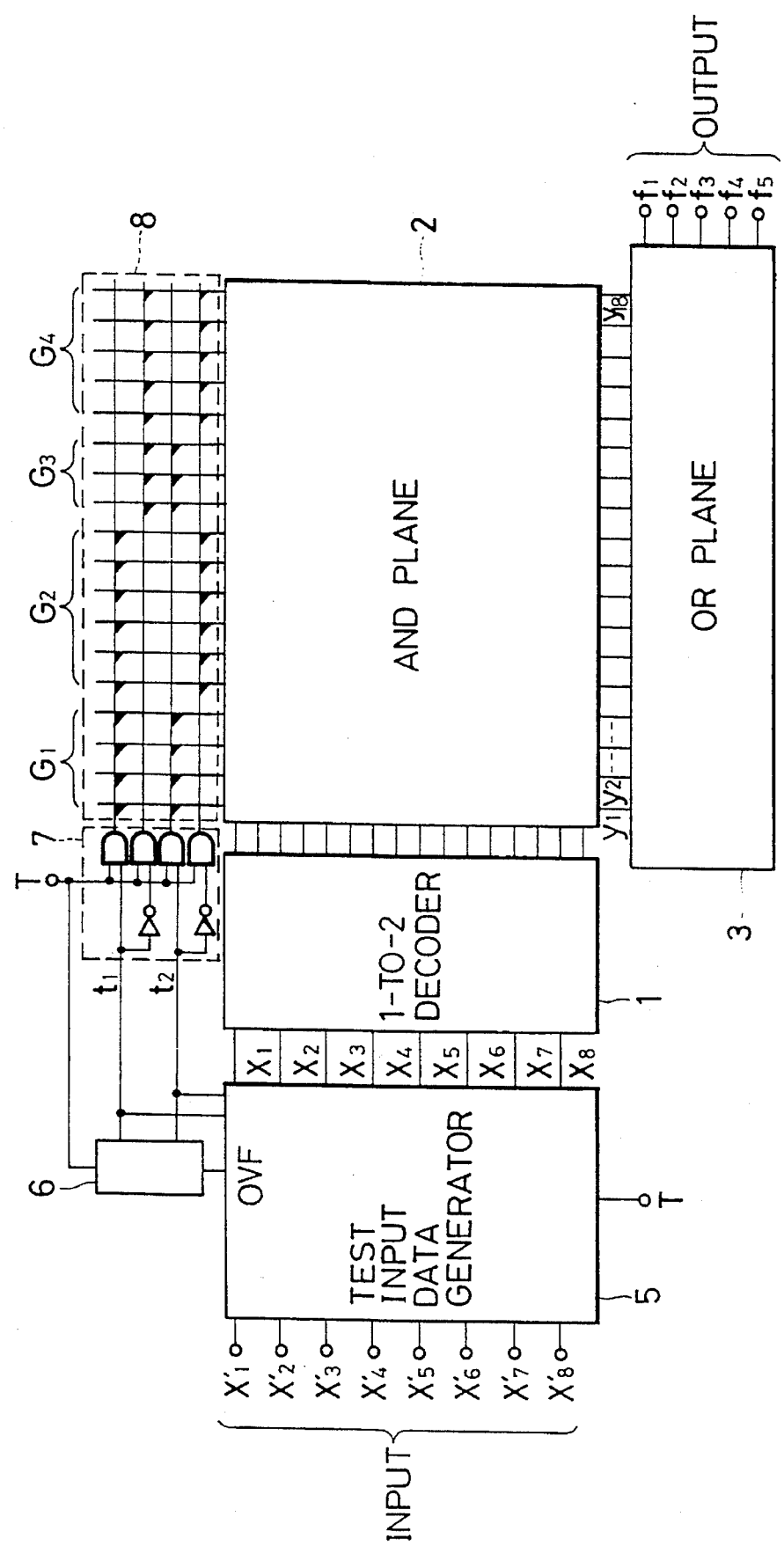
FIG. 9 is a detailed configuration diagram of a testable PLA with the testing circuit shown in FIG. 6.

FIG. 9 is a configuration diagram of a testable PLA with a self-testing circuit according to the first embodiment of the present invention.

In FIG. 9, identical components are labeled with the same reference numerals as in FIG. 5.

An additional AND plane 8 for activating one of product term line groups is simpler than the additional AND plane 23 for activating each product term line of FIG. 5.

The additional AND plane 8 is controlled through the 1-to-2 bit decoder 7 with an output disabling circuit by a counter 6 for activating a product term line group in the test operation mode (T=1). One of the groups is activated by the additional circuit 8. The important feature of the testable PLA with a test circuit according to the present invention is in the test input data generation circuit, which differs from the conventional testable PLA. Accordingly, in FIG. 9, the test input data generation circuit 5 is shown separate from the 1-to-2 decoder 1 and the input Xi (i=1, . . . , n) provided to the AND plane 2 show the same reference numbers used for the conventional testable PLA shown in FIG. 5, whereas the input Xi (i=1, . . . , n) denotes the input to the input register for the PLA during the normal operation mode.

The test input data generation circuit 5 operates as a D-type flip flop circuit during the normal operation mode (T=0), and in the test operation mode, it provides the fixed data and variable data to each product term line group activated by the counter 6.

A counter incorporated in the input data generation circuit 5 generates all possible combinations of variable parts of input data. After all test data for a product term line group is generated by the test data generation circuit 5, an overflow signal is generated by the test data generation circuit 5, then provided to the counter 6 to increment the counter 6 The test operation for the next group is then started. Thus, all groups are tested by the method described above.

In the embodiment shown in FIG. 9, the groups, G1 to G4, for which the number of product term lines is 4,6,3,5, respectively, are activated sequentially from the right side, according as the output (t1,t2) becomes (0,0), (0,1), (1,0), (1,1). The output (t1,t2) from the counter 6 is also provided to the input data generation circuit 5 to provide fixed data and variable data for each of product term line groups in the PLA.

This invention can be most applicable to a self testing method. The test data generation circuit can be used as an automatic test data generation circuit of the self testing method. A signature analyzer can be obtained by utilizing the output registers of the PLA as a parallel input LFSR. The number of bits in the LFSR must be at least greater than 20 or 30 to execute the signature analysis with high reliability, namely the low probability of aliasing. Therefore, if the number of the output bits of the PLA is small as in the embodiment shown in FIG. 9 (n=5), it is necessary to connect the output register of the PLA to form a reliable LFSR.

The counter in the test data generation circuit 5 can be replaced with the pseudo-random test data generation circuit. But, in this case, a somewhat complicated circuit to optimize a feedback position for each group of product term line is required.

By the present invention, it is possible to enable solely each of the product term lines for the OR plane, in this case, this method is not completely algorithmic, so that the following cases occur as exceptions, namely some product term line cannot be enabled solely.

(1) In two product term lines, a real crosspoint distribution on one product term line includes that for another product term line (inclusion relationship).

(2) All of real crosspoints on a product term line of a group in the AND plane are included in the region of the AND plane corresponding to the fixed data part of the input to the group.

(3) The distribution of real crosspoints corresponding to the variable part of the input to a group on two product term lines of the group falls into the case (1).

Figure 10:
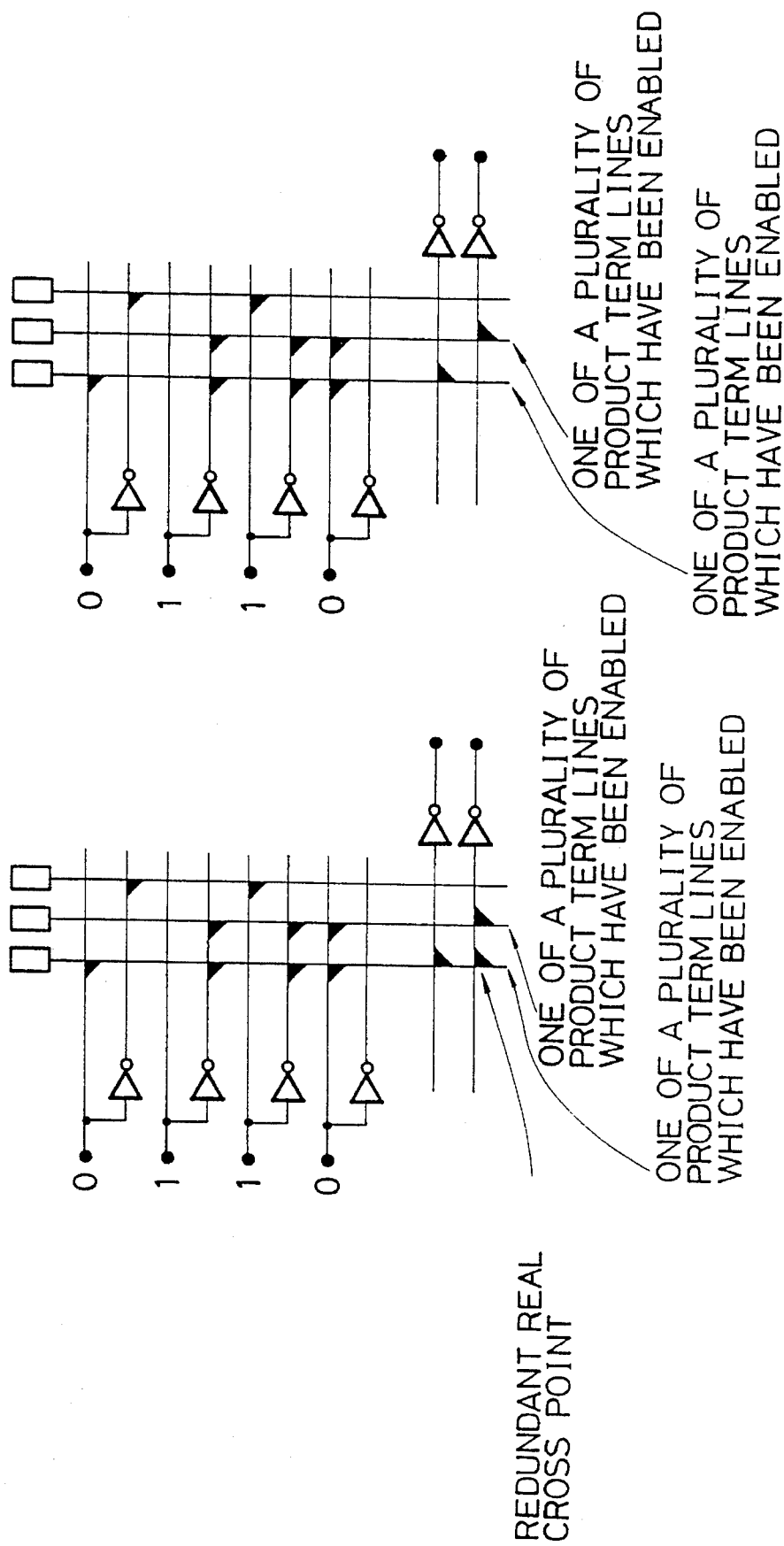
FIG. 10 shows an example in which a plurality of product term lines are enabled at the same time and a redundant real crosspoint exists.

In the case (1), as shown in FIG. 10, even if an input data is provided for the group only to enable a product term line on which the distribution of real crosspoints includes that on another product term line, two product term lines are invariably enabled at the same time. In this case, it is not possible to enable only the first product term line. However, the object of enabling each product term line is to surely detect crosspoint faults in the AND plane and OR plane. Even if two or more product term lines are enabled at the same time, it is sufficient that the enabling of the product term lines is clearly detected at the output of the PLA. When real crosspoints on the product term lines satisfying the relation (1) are overlapped when observed from the output side of the PLA for example, a relationship (xi·xj·xk+ xj·xk=xj·xk) is satisfied by the well known absorption rule, and the real crosspoints on the OR plane which overlap are redundant when they are observed from the output of the PLA. Therefore this is no problem because required testability is satisfied when the redundancy is eliminated (see FIG. 10).

In the cases (2) and (3), it can be assumed from the above discussion that, further including, a fixed data part, in the distribution of real crosspoints on the product term lines, there is no inclusion relationship as seen in the case (1) (the case (2) is a special case of the case (3)). Under that condition, by the second method of the present invention which uses fixed data obtained by inverting any one bit of the original fixed data, these product term lines in question can be enabled separately. Apart from the above, the most practical countermeasure for the cases are, to move the product term lines from one group to another, and to change the configuration of the fixed part and variable part of the input.

Thus it is easy to implement a practically excellent test for a PLA in on actual VLSI by considering tradeoffs between the area increase, the number of test cycles, and the fault coverage.

In order to efficiently analyze the above cases (1) to (3) and to obtain the maximum effect of the present invention, it is necessary to execute a logical simulation to make certain whether or not product term lines are suitably grouped and suitable fixed data is selected. This is easily carried out.

Figure 11:
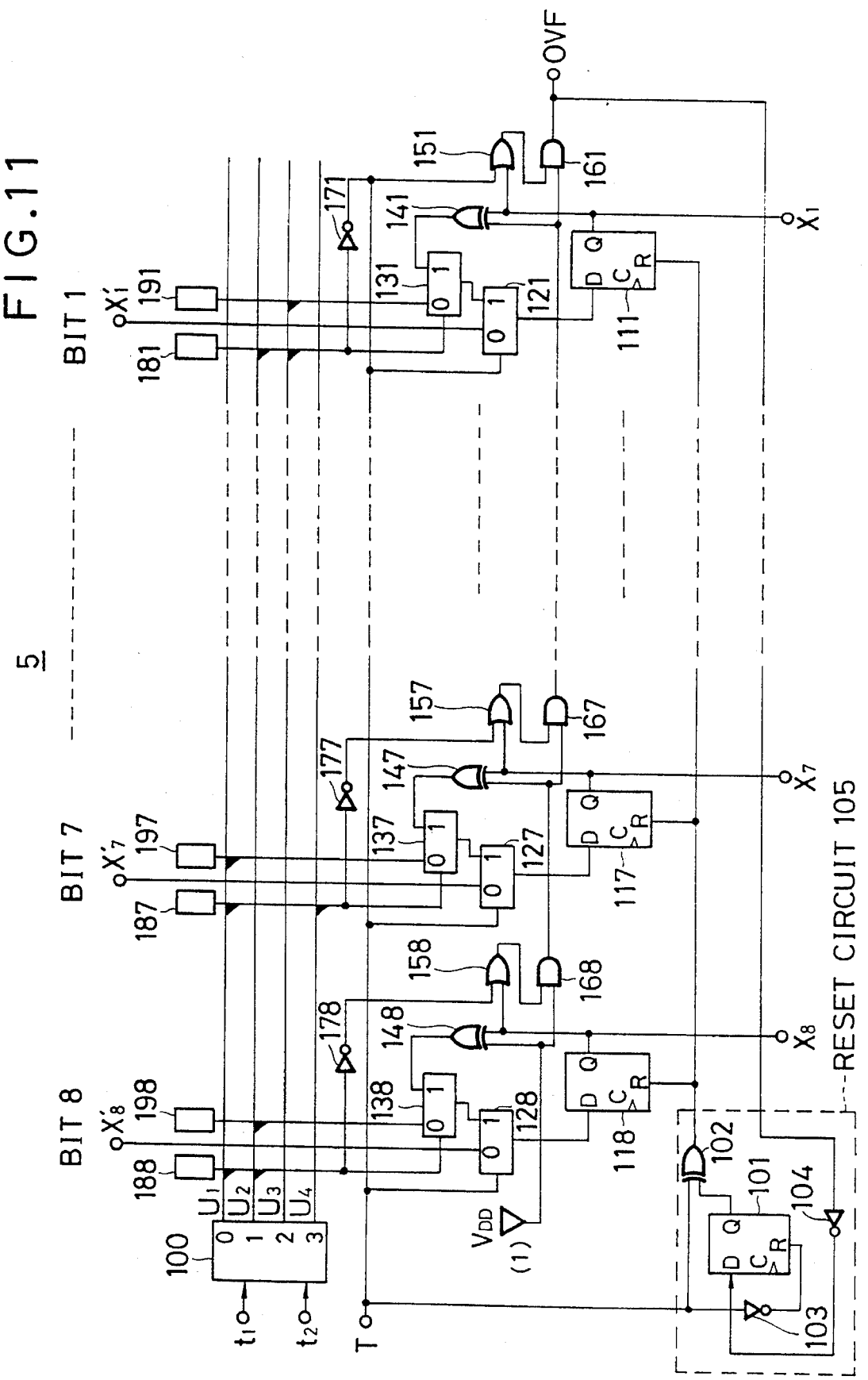
FIG. 11 is a configuration diagram of a test input data generation circuit incorporated in the PLA shown in FIG. 6.

FIG. 11 is a detailed configuration diagram of the test input data generation circuit 5 shown in FIG. 9.

The circuit 5 comprises a selection circuit 121 to 128 for selecting the normal input data Xi (i=1, ..., n) under the normal operation mode or the test input data under the test operation mode, a variable data or fixed data selection circuit 100, 131 to 138, and 181 to 188 (selection control lines) operating under the test operation mode.

A fixed data generation circuit 100 and 191 to 198 (fixed data output lines), a half-adder comprising XOR gates 141 to 148, OR gates 151 to 158, and AND gates 161 to 168, D-type flip flops 111 to 118 with a reset function, and a reset circuit 105 including a flip flop 101, an XOR gate 102, and inverters 103 and 104.

The reference numeral 100 designates a 2-to-4 decoder, the reference numerals 121 to 128, 131 to 138 denote multiplexers.

The input data generation circuit 5 operates as a flip flop during the normal operation mode (T=0). The input Xi' (i=1, ..., 8) is output through the D-type flip flop 111 to 118 with the reset function as Xi after 1 clock cycle.

In the flip flops 111 to 118, R designates the reset terminal, and C designates the clock input terminal (the wiring in the flip flops 111 to 118 is not shown).

During the test operation mode (T=1), one of the outputs u1, ..., u4 from the 2-to-4 decoder 100 is enabled, namely becomes , according to the value (t1,t2) for activating one of groups consisting of predetermined product term lines.

Cross points are formed between the decoder output lines u1, ..., u4 and the variable data/fixed data selection control lines 181 to 188, and between the former and the fixed data output lines 191 to 198 indicating t value of fixed data. The output of these lines 181 to 188 and 191 to 198 according to the output of u1 to u4 is determined by the distribution of transistors at the crosspoints like a PLA.

A bit of fixed data corresponds to a real cross point and a bit of variable data to an empty crosspoint formed between the selection control lines 181 to 188 and the decoder output lines u1 to u4.

Further, the two values of one bit fixed data 0' and 1' correspond to a real crosspoint and an empty crosspoint respectively formed between the fixed data output lines 191 to 198 and the decoder output lines u1 to u4.

In FIG. 11, the configuration of the circuit for bits 1 to 8 except the decoder 100 and the reset circuit is identical with one another, except for the distribution of real crosspoints in the variable data/fixed data selection circuit and the fixed data generation circuit. The carry input to the circuit of the bit 8 is fixed to 1. In addition, the carry out output CVF of the bit 1 is input to the reset circuit.

Next, the operation of the input data generation circuit 5 during the test operation mode (T=1) in two cases—when variable data is selected and when fixed data is selected—will be described at the bit 7. Variable data is selected at the bit 7 when the line u2 or u3 is enabled, and fixed data is selected when the line u1 or u4 is enabled, according to the distribution of real crosspoints where the selection control line 187 is crossed with decode output lines u1 to u4. The logical value of the selection control line 187 becomes 1 when variable data is selected, so that the multiplexer 137 selects the output of the XOR gate 147, specifically the sum at the bit 7. In addition, because T=1 and the multiplexer 127 selects data from the multiplexer 137, the sum is provided for the flip flop 117, then the flip flop 117 is counted up. Moreover, since the inverted value 0 of the selection control line 187 is provided for one of the inputs of the OR gate 157, the output of the AND gate 167 equals to the normal carryout from the bit 7.

On the other hand, the logical value of the selection control line 187 becomes 0 when fixed data is selected, so that the multiplexer 137 selects data from the fixed data output line 197. The fixed data is provided for the PLA through the multiplexer 127 and the flip flop 117.

In addition, the inverted value 1 of the value of the selection control line 187 is input to the OR gate 157, the AND gate 167 transfers the carry from the lower bit (bit 8) to the upper bit 6 regardless of the result of the addition operation at the bit 7. Thus, a counter comprises only the bits for which variable data is provided. The reset circuit 105, which comprises the D-type flip flop 101 having the reset function, the XOR gate 102, and the inverters 103 and 104, resets the counter when the PLA enters the test operation mode (when T changes from 0 to 1) and the carryout output OVF from the uppermost bit of the counter (not necessarily the bit 1) becomes 1.

Here it should be noted that the present invention is not restricted to the embodiment described above. The same results can be obtained with, for example, another high speed counter instead of the counter described above.

Next, in addition to the embodiment described above, another embodiment will be explained. In this embodiment, crosspoint faults in a part in the AND plane for which the fixed data is provided can be also detected.

First, in this embodiment as in the first embodiment shown in FIG. 11, for each group of product term lines, the fixed data which becomes ineffective for the output of the product term lines in logical value (or makes real crosspoints between the literal input lines corresponding to the input bits and the product term lines enter the off state) is provided through the input bits of the PLA from which the common distribution of crosspoints observed. The rest of the input bits are provided with variable data. By the above, crosspoint faults in the part of the AND plane corresponding to variable data and those in the OR plane are detected.

Then, one-bit inverted fixed data with arbitrary one bit of the original fixed data inverted is used to detect crosspoint faults at the part corresponding to the inverted bit in the AND plane.

This operation is carried out for all product term line groups for all bits of fixed input data. Thus, all crosspoint faults in the AND plane can be detected. In the embodiment, the approximate number of test cycles, as described above, is $(1+f) \times 2^{n+g-f}$, where n is the number of inputs, $2^g$ is the number of groups of product term lines, and f is the number of the smallest fixed input data bits. The exact number of test cycles for the embodiment of the grouping shown in FIG. 8 is $(1+11) \times 2^{22-11} + 2(1+12) \times 2^{22-12} = 100,000$ cycles. However, this value is much smaller than 4,000,000 cycles where all possible input data is provided for the PLA.

Figure 12:
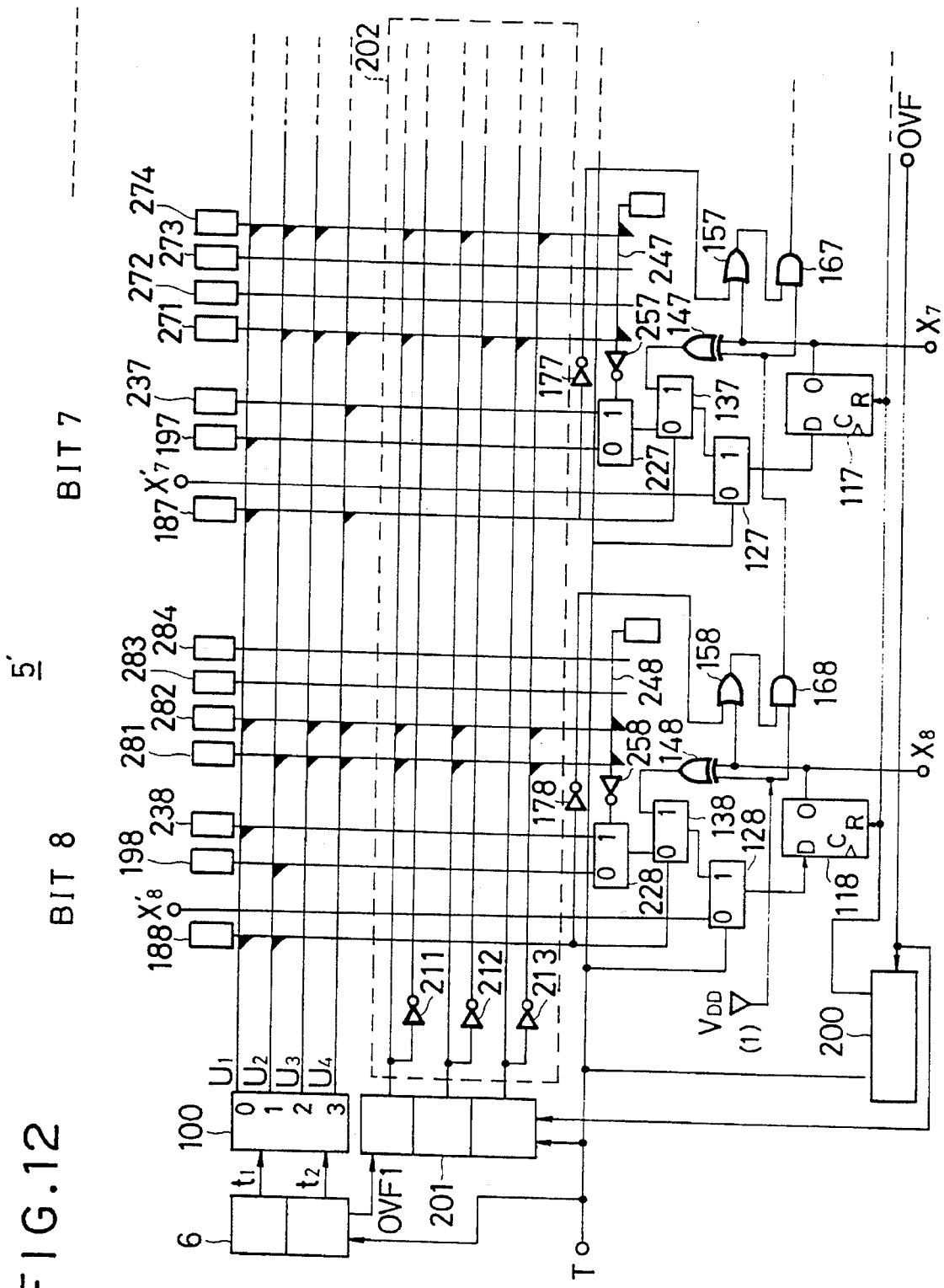
FIG. 12 is a configuration diagram of another test input data generation circuit incorporated in the PLA shown in FIG. 6.

FIG. 12 shows a configuration diagram of a test input data generation circuit having the above test function.

The uppermost bit (the bit 1) is omitted and only the lowermost 2 bits (the bit 8 and the bit 7) are drawn in the diagram for simplicity.

In this diagram, reference numerals which are the same as used in FIG. 11 have the same function. Further, the counter 6 for activating each of the product term line groups is equal to that used in FIG. 9, and the reset circuit 200 is equal to the reset circuit 105 shown in FIG. 11.

In this embodiment, functions added to the functions of the first embodiment shown in FIG. 11 are mainly described.

To invert one arbitrary bit of fixed data, a circuit to designate each bit of the fixed data is required. This circuit for inverting one arbitrary bit in the fixed data, for example, comprises the counter 201, the fixed data selection decode circuit 202 which has a similar structure to a PLA, the fixed data inversion selection lines groups 271 to 274 (corresponding to the bit 7), 281 to 284 (corresponding to the bit 8) each group of which is incorporated in each bit of the test data generation circuit, and the fixed data inversion selection control lines 247, 248 as the selection signals for multiplexer 227, 228 inverted by the inverters 257, 258. The inverters 257, 258 can be omitted if the combination of the inputs of the multiplexer 227, 228 are changed.

Since the position of fixed data differs for each group of product term lines, the same number of fixed data inversion selection lines is prepared for each bit as that of the product term line groups.

A fixed data inversion selection line is activated at each bit according to the output of the 2-to-4 decoder 100. Where fixed data is not selected, the corresponding fixed data inversion selection line is not used, specifically, is made "don't care" by not forming a real crosspoint between the fixed data inversion selection line and a fixed inversion selection control line. However, in this embodiment, the bit position and sequence of fixed data inversion can be programmed freely by placing real crosspoints in the fixed data selection decode circuit 202, so that the test operation of PLAs with various distribution of crosspoints can be implemented with high flexibility. This is a great advantage of this embodiment. This embodiment according to the second method of the present invention can be applied to a case in which the number of the group of product term lines is relatively small, such as 2 to 6.

The output bits of the counter 201 are all 0, namely (0,0,0), during the normal operation mode (T=0). During the test operation mode (T=1), the counter 201 is incremented by receiving the overflow signal OVF from the test input data generation circuit 5'. When the output of the counter 201 is zero, namely when all bits are zero, the logical value of all fixed data inversion selection lines is zero, so that the output from the fixed data output lines 197, 198 at the bit positions related to the variable data/fixed data selection control lines 187, 188 with zero values are output through the multiplexers 227, 228 to the PLA as fixed data, in the same manner as the embodiment shown in FIG. 11.

As the output of the counter 201 is counted up from 1 or (0, 0, 1) in sequence, the fixed data which is inverted only by one bit at the 1st bit (the lowest bit), the 2nd bit, . . . of the original fixed data according to each group of product term lines, is provided for the PLA. For example, when the product term line group 1 is activated (according to u1=1), the bits 8 and 7, according to the crosspoints between the line u1 and the variable data/fixed data selection control lines 188, 187 are designated as the fixed data. When the counter 201 is (0,0,1), only the fixed data inversion selection line 281 is 1 and the fixed data inversion selection control line 248 is zero, so that the output 0 of the inverted fixed data output line 238 is output to the PLA, which is the inverted value of output 1 from the fixed data output line 198.

In this embodiment, thus, when the counter 201 is (0,0,1), the fixed data of which only the bit 8 is inverted and the other bits, 1 to 7 equal to the original fixed data used in the embodiment shown in FIG. 11 are provided for the PLA. Similarly, when the value of the counter 201 is (0,1,0), the multiplexer 227 outputs the inverted fixed data, so that the fixed data with only the bit 7 inverted is provided for the PLA.

When the product term line group 2 is activated (according to u2=1), although fixed data is provided at the bit 8, fixed data is not provided at the bit 7.

Accordingly, a fixed data inversion selection line which becomes 1 according to the value (0,1,0) of the counter 201 exists at a bit position other than the bit 7.

In FIG. 12, the overflow signal OVF1 from the counter 201 functions as the trigger signal for counting up the product term line group activation counter 6. After the test operation of a selected product term line group is completed and the counter 6 is counted up, the next product term line group is activated in sequence.

As can be clearly understood from the above description, the number of bits nc of the counter 201 is determined as the minimum number satisfying the following relationship: $2^{nc} > 1+F$ (F is the maximum number of fixed data bits for product term line groups). The area of the test additional circuit shown in FIG. 12 is larger than that of the embodiment shown in FIG. 11, namely the counter 201 and the fixed data selection decode circuit 202 are further added in this embodiment shown in FIG. 12. However, the additional area can be reduced by using circuitry similar to a PLA.

By adding the additional circuit, the crosspoint faults in the PLA can be almost perfectly detected, so that a test with very high quality for the PLA can be achieved.

Next, another embodiment according to the test input data generation circuit will be described referring to FIG. 13. To simplify the explanation, the uppermost bit (the bit 1) is neglected as in the embodiment shown in FIG. 12.

This embodiment is similar to the embodiment shown in FIG. 12 in the point that fixed data and other fixed data with arbitrary one bit of the fixed data inverted are used, but differs with respect to the mechanism of generating these fixed data.

In the following description, the different point is mainly explained.

In the embodiment shown in FIG. 12, the fixed data inversion selection lines including 271 to 274 and 281 to 284 are placed at all input bits to designate the inverted bit of the original fixed data. During the test of one product term line group, when one input bit is not designated as fixed data, no real crosspoint is placed on the corresponding fixed data inversion selection line in the fixed data selection decode circuit 202. In this embodiment, when the number of product term line groups is increased, the area increase of the additional circuit cannot be neglected.

Figure 13:
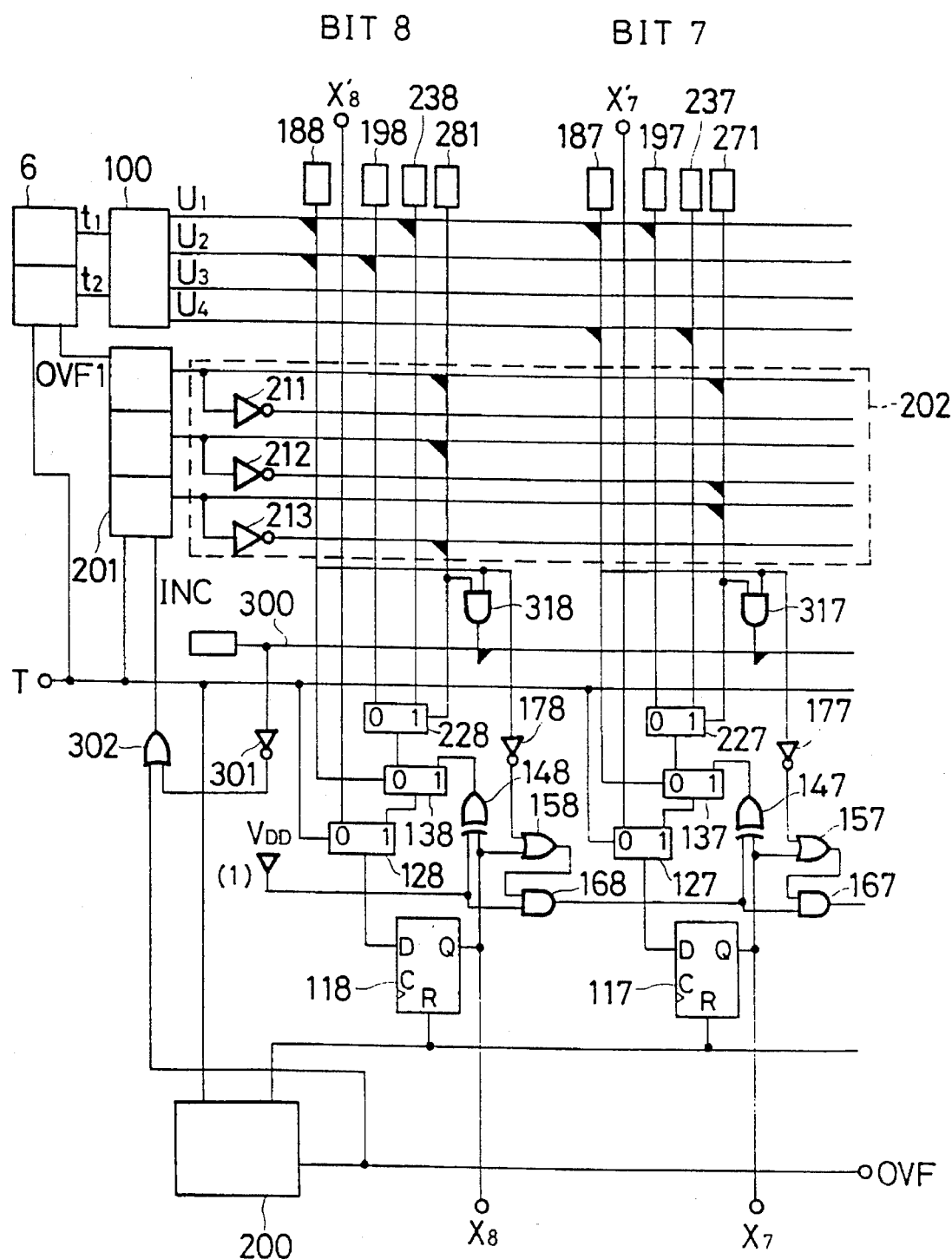
FIG. 13 is a configuration diagram of another test input data generation circuit incorporated in the PLA shown in FIG. 6.

On the other hand, in the embodiment shown in FIG. 13, firstly, the position of one bit to be inverted is predetermined according to the output of the counter 201. For example, when the value of the counter 201 is (0,0,0), (0,0,1), (0,1,0), ..., the original fixed data, another fixed data with the bit 8 of the original one inverted, and another fixed data with the bit 7 of the original one inverted, ..., are output through the multiplexer 228 and 227, .... Further, when fixed data is designated by a variable data/fixed data selection control line corresponding to a bit whose inversion is designated, fixed data with that bit of the original one inverted is actually provided for the PLA. Thus, each bit requires only one data inversion selection line.

For example, the bit 8 requires the fixed data inversion selection line 281, and the bit 7 requires the line 271, .... However, the number of bits nc of the counter 201 is the minimum integer which satisfies the following relationship. This is a little greater than that of the embodiment shown in FIG. 12:

$$2^{nc} > 1 + (\text{the number of the input bits of the PLA}).$$

When there are a large number, namely more than 7 or 8, of product term line groups, the embodiment shown in FIG. 13 is better than the embodiment shown in FIG. 12 with respect to area increase. On the other hand, since the number of test cycles becomes $((1+(\text{the number of input bits of the PLA}))\times 2^{n+g-f})$, in some cases, the number of test cycles may become twice that of the embodiment shown in FIG. 12. This is a serious problem.

To avoid an increase in the number of test cycles in this embodiment, the counter 201 is incremented and then the test operation moves on to the next when, at a bit, inverted fixed data and variable data are doubly designated during a test using one-bit inverted fixed data.

Specifically, for example, the output of the fixed data inversion selection line 271 or 281 and the output of the variable data/fixed data selection control line 187 or 188 are input to the AND gate 317 or the AND gate 318, respectively.

These outputs of the AND gates are provided for the inverted fixed data/variable data overlapped designation detector 300 through real crosspoints. The output of the detecter 300 is input to one input terminal of the OR gate 302 through the inverter 301. The overflow signal OVF of the variable data providing counter in the test input data generation circuit is provided for another input terminal of the OR gate 302. The output of the OR gate 302 serves as the counting up signal INC for the counter 201.

Thus, the counter 201 is incremented when the provision of the variable test data is completed in the test using an original fixed data for each product term line group or another fixed data with one arbitrary bit of the original one inverted, and when variable data and inverted fixed data is doubly designated at a bit.

As compared to the embodiment shown in FIG. 12, in the embodiment shown in FIG. 13, there is only one extra cycle for each bit designated as variable data.

Therefore, the additional number of test cycles becomes approximately $2^{g\times}((\text{the number of the inputs of the PLA})-f)$ during the test operation for the PLA. This number can be neglected in all test cycles for the PLA. Therefore the number of test cycles for the embodiment shown in FIG. 13 is nearly equal to that of the embodiment shown in FIG. 12.

As understood from the above, the embodiment shown in FIG. 13 is more advantageous than the embodiment shown in FIG. 12 mainly with respect to area increase when the number of product term line groups is large, for example, more than 7 or 8.

The test input data generation circuit according to the embodiment described above can easily be replaced with a circuit which is not similar to a PLA.

Moreover, the method of the present invention can be applied to a system comprising a plurality of PLAs.

Furthermore, in special cases which have already been described above, when almost all product term lines of a PLA to be tested have a similar distribution of crosspoints observed from the input of the PLA, the grouping of product term lines into two or more groups is not necessary. In this case, a product term line group activation circuit is unnecessary. All the above are included in the scope of the present invention.

Finally, we should point out that in a testable PLA with a test circuit according to the present invention relatively loose conditions can be applied in grouping of product term lines because original fixed data and fixed data with one arbitrary bit of the original fixed data inverted are treated equally in the present invention.

That is, in a product term line group, with a negligible decrease in the coverage of crosspoint faults, there can be exceptional product term lines of a suitable number, each of which has a distribution of crosspoints in the part of the input bits corresponding to fixed data on itself different by one bit from that on the product term lines of the group excluding the exceptional ones.

These product term lines must be solely enabled during the whole test for the PLA, as has been already described. These product term lines are not enabled by variable data under an original fixed data, however during the test using fixed data which differ from the original one at the above mentioned bit, according to the combination of the variable data, each of these product term lines is enabled.

Specifically, the loose condition for the grouping of product term lines leads to an increase in the bit length of fixed data and to a decrease in the number of test cycles, so that the method can be highly applicable to a practically excellent implementation of a testable PLA according to the present invention.

The present invention has thus been shown and described with reference to specific embodiments. However, it should be noted that the invention is in no way limited to the details of the illustrated structure but changes and modifications may be made within the scope of the appended claims.

What is claimed is:

1. A testable Programmable Logic Array (PLA) operable in a normal operation mode and a test operation mode, comprising:

a PLA comprising an AND plane and an OR plane including
a plurality of input terminals,
a decoder connected to the plurality of input terminals,
a plurality of input lines connected to output terminals of the decoder,
a plurality of output lines,
a plurality of product term lines which cross the plurality of input lines and the plurality of output lines, and
a plurality of elements formed on crosspoints among the plurality of product term lines, the plurality of input lines, and the plurality of output lines, the plurality of elements having a crosspoint distribution to be tested; and data providing means for providing test data to execute a test for the plurality of elements during the test operation mode, the test data having first fixed data and variable data generated by the data providing means, the first fixed data being provided to a first part of the plurality of input lines in which the distribution of the elements formed between each input line in the first part of the plurality of input lines and the plurality of product term lines is the same, all elements formed on crosspoints between all input lines to the AND plane being fixed by receiving the first fixed data and the corresponding plurality of product term lines being turned OFF, the variable data being provided to another part of the plurality of input lines in which a distribution of the elements formed between each input line in the another part of the plurality of input lines and the plurality of product term lines is different from each other.

2. A testable Programmable Logic Array (PLA) as claimed in claim 1, further comprising means, in the data providing means, for generating second fixed data which are obtained by inverting the first fixed data and for providing the second fixed data to the first part of the plurality of input lines.

3. A testable Programmable Logic Array (PLA) operable in a normal operation mode and a test operation mode, comprising:

an AND plane and an OR plane including
a plurality of input terminals connected to a decoder,
a plurality of input lines connected to output terminals of the decoder,
a plurality of output lines,
a plurality of product term lines which cross the plurality of input lines and the plurality of output lines, the plurality of product term lines being grouped into at least two groups, and
a plurality of elements formed on crosspoints among the plurality of product term lines, the plurality of input lines, and the plurality of output lines, the plurality of elements having a crosspoint distribution to be tested, selection means for successively selecting one of the groups of the product term lines;

activation means for activating a selected group; and data providing means for providing test data having predetermined data and variable data corresponding to a distribution of elements formed at crosspoints between the product term lines of each selected group and the input lines, for implementing a test for each part of the PLA covered by the product term lines of each selected group for the AND plane during the test operation mode, the test data having first fixed data generated by the data providing means, the first fixed data being provided to a first part of the plurality of input lines in which the distribution of the elements formed between each input line in the first part of the plurality of input lines and the plurality of product term lines is the same, all elements formed on crosspoints between all input lines to the AND plane being made fixed by receiving the first fixed data and the corresponding plurality of product term lines being turned OFF, the variable data being provided to another part of the plurality of input lines in which a distribution of the elements formed between each input line in the another part of the plurality of input lines and the plurality of product term lines is different from each other, a distribution of the elements in each of the plurality of input lines in each group being different from each other at a predetermined number of crosspoints.

4. A testable Programmable Logic Array (PLA) as claimed in claim 3, further comprising means, in the data providing means, for generating second fixed data which are obtained by inverting the first fixed data and for providing the second fixed data to the first part of the plurality of input lines.

5. A testable PLA according to claim 3, wherein the predetermined number of crosspoints is one.

6. A testable PLA according to claim 3, further comprising a first counter for controlling the operation of the selection means and the activation means, and a second counter for providing the variable data.

7. A testable PLA according to claim 6, wherein the first counter and the second counter form a pseudo-random data generator.

8. A testable PLA according to claim 3, wherein the data providing means provides fixed data, one-bit inverted fixed data with one arbitrary bit in the fixed data inverted, and variable data according to the distribution of elements on product term lines in the selected group.

* * * * *